(12) United States Patent
Lin (10) Patent No.: US 12,317,433 B2
(45) Date of Patent: May 27, 2025

(54) CASE OF ELECTRONIC DEVICE AND UNLOCKING METHOD THEREOF

(71) Applicant: AMITA TECHNOLOGIES INC., Taoyuan (TW)

(72) Inventor: Chen-Fan Lin, Taoyuan (TW)

(73) Assignee: AMITA TECHNOLOGIES INC., Taoyuan (TW)

( * ) Notice: Subject to any disclaimer, the term of this patent is extended or adjusted under 35 U.S.C. 154(b) by 235 days.

(21) Appl. No.: 18/208,253

(22) Filed: Jun. 9, 2023

(65) Prior Publication Data

US 2024/0334623 A1    Oct. 3, 2024

(30) Foreign Application Priority Data

Mar. 30, 2023  (TW) ................................. 112112280

(51) Int. Cl.
*H05K 5/02*  (2006.01)
*H05K 5/13*  (2025.01)
*H05K 5/30*  (2025.01)

(52) U.S. Cl.
CPC ......... *H05K 5/0208* (2013.01); *H05K 5/0221* (2013.01); *H05K 5/0234* (2013.01); *H05K 5/13* (2025.01); *H05K 5/30* (2025.01)

(58) Field of Classification Search
CPC ........................... H05K 5/0208; H05K 5/0221
See application file for complete search history.

(56) References Cited

U.S. PATENT DOCUMENTS

| | | | |
|---|---|---|---|
| 2015/0085439 A1* | 3/2015 | Lee | H05K 7/1481 361/679.21 |
| 2016/0073540 A1* | 3/2016 | Chang | H04B 1/3818 361/756 |
| 2020/0274432 A1* | 8/2020 | Wauke | H02K 33/06 |
| 2021/0067021 A1* | 3/2021 | Maeda | H02K 33/16 |

\* cited by examiner

*Primary Examiner* — Sherman Ng
(74) *Attorney, Agent, or Firm* — Chun-Ming Shih; HDLS IPR SERVICES (57) ABSTRACT

This disclosure is directed to a case of an electronic device having a box, an elastic arm, a first fastening structure, a second fastening structure, and a magnet. The box has a first housing and a second housing closed with the first housing. The elastic arm is arranged in the first housing, the elastic arm is located at one side of the first housing, and at least a portion of the elastic arm is extended beyond an edge of the first housing. The first fastening structure is disposed on the elastic arm and located beyond the edge of the first housing. The second fastening structure is arranged on an internal surface at one side of the second housing, and the first fastening structure and the second fastening structure are buckled with each other. The magnet is arranged on the spring arm.

11 Claims, 7 Drawing Sheets

CASE OF ELECTRONIC DEVICE AND UNLOCKING METHOD THEREOF

BACKGROUND OF THE DISCLOSURE

Technical Field

This disclosure is directed to a case of electric device and in particular to a case of electric device unlocked by a magnetic force and an unlocking method thereof.

Related Art

A related-art high-voltage or high-power electronic devices such as an electric vehicle battery is usually accommodated in a case, thereby preventing the electronic device from damage caused by an external force or an improper operation. The case is also capable of preventing from injuries to people caused by an unexpected touch. However, the case is usually locked with a bolt or locked with an external buckle. Therefore, the case is prevented from being accidentally opened by an unexpected person, but the case is not prevented from being intentionally opened by an unexpected person.

In views of this, in order to solve the above disadvantage, the inventor studied related technology and provided a reasonable and effective solution in this disclosure.

SUMMARY OF THE DISCLOSURE

This disclosure is directed to a case of electric device which may be unlocked by a magnetic force and an unlocking method thereof.

This disclosure is directed to a case of an electronic device having a box, an elastic arm, a first fastening structure, a second fastening structure, and a magnet. The box has a first housing and a second housing closed with the first housing. The elastic arm is arranged in the first housing, the elastic arm is located at one side of the first housing, and at least a portion of the elastic arm is extended beyond an edge of the first housing. The first fastening structure is disposed on the elastic arm and located beyond the edge of the first housing. The second fastening structure is arranged on an internal surface at one side of the second housing, and the first fastening structure and the second fastening structure are buckled with each other. The magnet is arranged on the spring arm.

According to an embodiment of this disclosure, the magnet is disposed beyond the edge of first housing.

According to an embodiment of this disclosure, the magnet is arranged on the elastic arm corresponding to a position of the first fastening structure.

According to an embodiment of this disclosure, one of the first fastening structure and the second fastening structure is a buckling hole, and another of the first fastening structure and the second fastening structure is a latch buckling the buckling hole.

According to an embodiment of this disclosure, the second fastening structure is a protrusion block, the first fastening structure is a latch buckling the protrusion block.

According to an embodiment of this disclosure, the case of electric device further has a first connecting structure arranged at another side of the first housing opposite to the first fastening structure and a second connecting structure arranged at another side of the second housing opposite to the second fastening structure. The first connecting structure is connected with the second connecting structure.

According to an embodiment of this disclosure, case of electric device further has another elastic arm disposed at another side of the first housing opposite to the first fastening structure and provided with a first fastening structure and another second fastening structure disposed at another side of the second housing opposite to the second fastening structure. The first fastening structures are buckled with the second fastening structures respectively.

According to an embodiment of this disclosure, case of electric device further has at least one bolt, the first housing and the second housing are screwed with each other by the bolt.

According to an embodiment of this disclosure, the second fastening structure has a guiding slope capable of guiding the first fastening structure to move to a position to buckle the second fastening structure.

This disclosure is directed to an unlocking method of a case of electric device, the unlocking method has following steps. Firstly, a case of electric device and an unlocking magnet are provided, the case of electric device having a box, an elastic arm, a first fastening structure, a second fastening structure and a magnet. The box has a first housing and a second housing closed with the first housing, the elastic arm is arranged in the first housing and at one side and of the first housing, at least a portion of the elastic arm is extended beyond an edge of the first housing, the first fastening structure is arranged on the elastic arm and beyond the edge of the first housing, the second fastening structure is arranged on an internal surface at one side of the second housing, the first fastening structure and the second fastening structure are buckled with each other. The magnet has a first magnetic pole, the first magnetic pole is arranged toward an internal surface of the second housing. The unlocking magnet has a second magnetic pole the same as the first magnetic pole in magnetic polarity. Then, the unlocking magnet is moved to approach a position corresponding to the magnet, the position is defined on an external surface of the second housing, and the second magnetic pole is disposed toward the first magnetic pole so as to move the magnet away from the unlocking magnet by a repulsive magnetic force between the first magnetic pole and the second magnetic pole. The magnet deflects the elastic arm when moving so as to release the first fastening structure from the second fastening structure.

According to an embodiment of this disclosure, the first housing and the second housing are screw with each other by a bolt, and the bolt is loosened before moving the unlocking magnet to approach the second housing, so as to release the first housing from the second housing.

Accordingly, a first fastening structure 310 and second fastening structure buckled with each other are disposed in the case of electric device of this disclosure has so as to lock the first housing with the second housing to prevent locking structures from exposing, so that the case of electric device is prevented from being opened by an unexpected person. An expected operator may move the magnet on the elastic arm by the unlocking magnet so as to release the first fastening structure from the second fastening structure.

BRIEF DESCRIPTION OF DRAWINGS

This disclosure can be more fully understood by reading the following detailed description of the embodiment, with reference made to the accompanying draw.

DETAILED DESCRIPTION

According to FIGS. 1 to 4, the first embodiment of this provides a case of electric device having a box 100. In the box 100, at least one elastic arm 200 is provided, and a first fastening structure 310, a second fastening structure 320 and a magnet 400 corresponding are arranged to this elastic arm 200.

The box 100 has a first housing 110 and a second housing 120 opposite to the first housing 110 and closed with the first housing 110. The box 100 is used for accommodating an electric device (not be shown in figures) therein, and electrodes 131,132 for electrically connecting to the electric device may be selectively disposed on an external surface of the box 100 corresponding to the electric device in the box 100. According to this embodiment, the first housing 110 is an upper cover and the second housing 120 is a bottom case, but scopes of this disclosure should not be limited to the embodiment. For example, the first housing 110 may be a bottom case having an opening, and the second housing 120 may be an upper cover for closing the opening on the bottom case. The first housing 110 and the second housing 120 may be half cases. The upper cover may be various types such as a lid having an opening or cover plate.

The elastic arm 200 is arranged in the first housing 110, the elastic arm 200 is disposed at one side of the first housing 110, and at least a portion of the elastic arm 200 is extended beyond an edge of the first housing 110. If the first housing 110 is the cover having an opening or the bottom case having an opening, the aforementioned edge is directed to an edge of the opening of the cover or the opening of the bottom case. If the first housing 110 is the cover plate, the aforementioned edge is directed to an edge of the cover plate.

The first fastening structure 310 is arranged on the elastic arm 200 and beyond the edge of the first housing 110. The second fastening structure 320 is arranged on an internal surface at one side of the second housing 120, the first fastening structure 310 and the second fastening structure 320 are buckled with each other. When the first housing 110 is closed with the second housing 120, the elastic arm 200, first fastening structure 310 and the second fastening structure 320 are accommodated in the box 100. According to this embodiment, the second fastening structure 320 is a protrusion block, the first fastening structure 310 is a latch buckling the protrusion block. Moreover, a guiding slope 321 is arranged on the protrusion block, thereby guiding the first fastening structure 310 to move across the protrusion block from one side of the protrusion block so as to buckle another side of the protrusion block.

The magnet 400 is arranged on the elastic arm 200. According to this embodiment, the magnet 400 is located beyond the edge of first housing 110. Specifically, the magnet 400 is arranged on the elastic arm 200 corresponding to a position of the first fastening structure 310.

According to this embodiment, on the first housing 110, another elastic arm 200a may be arranged at another side of the first housing 110 opposite to the first fastening structure 310 aforementioned, another first fastening structure 310a and another magnet 400a are arranged on this another elastic arm 200a. Correspondingly, on the second housing 120, another second fastening structure 320a is arranged at another side of the second housing 120 opposite to the second fastening structure 320 aforementioned. The first fastening structures 310 are correspondingly buckled with the second fastening structures 320 respectively.

Figure 1:
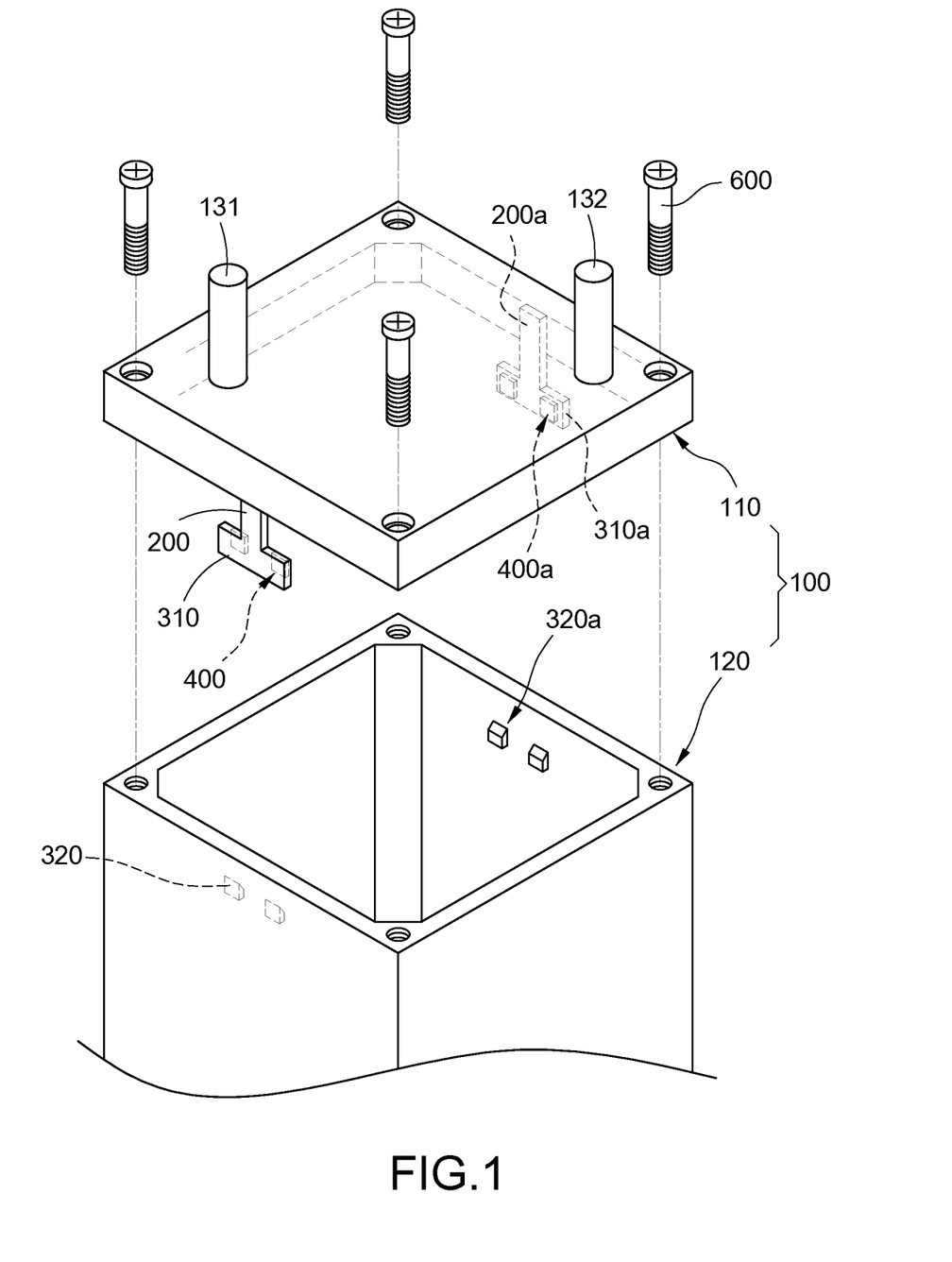
FIG. 1 is an exploded view showing a case of electric device according to the first embodiment of this disclosure.
Figure 2:
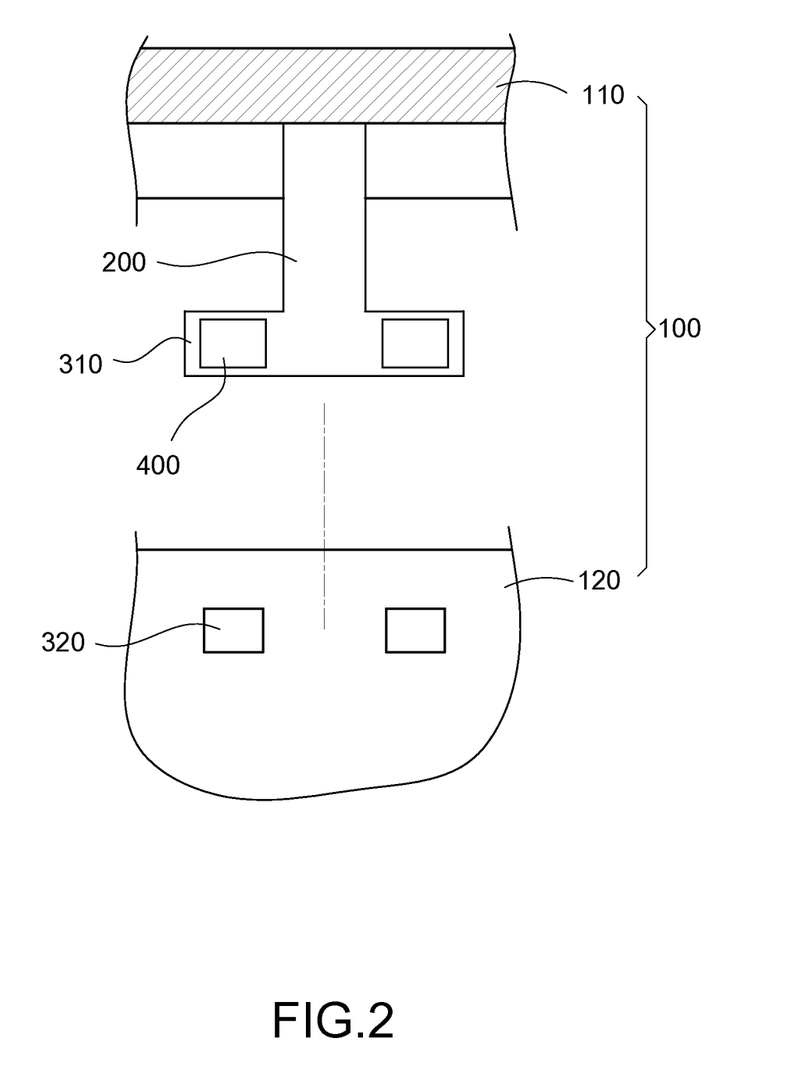
FIGS. 2 to 4 are perspective views showing a first fastening structure and a second fastening structure of the case of electric device according to the first embodiment of this disclosure.
Figure 3:
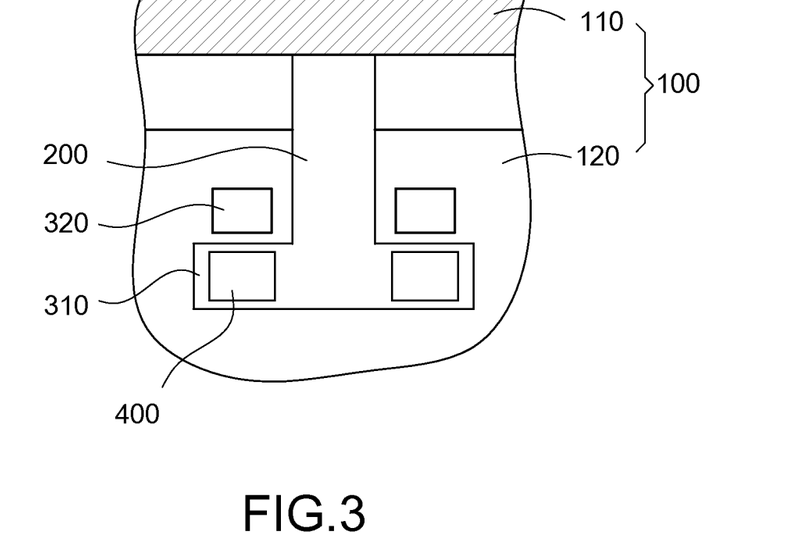
Figure 4:
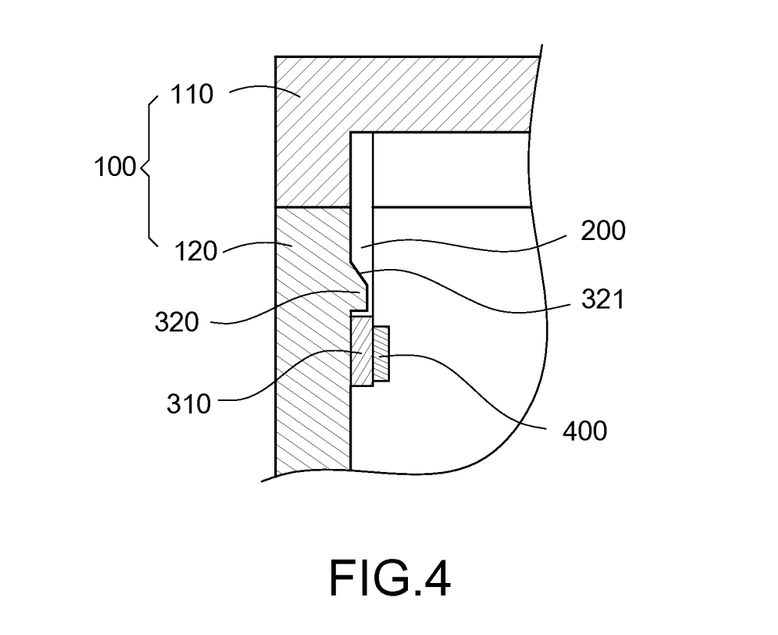

According to this embodiment, the case of electric device further has at least one bolt 600, and the number of the bolt(s) 600 should not be limited in this disclosure, the first housing 110 and the second housing 120 are fixed with each other by the bolt 600. Specifically, the bolt 600 penetrates the first housing 110 from an outside of the first housing 110 and then screw to the second housing 120.

Figure 5:
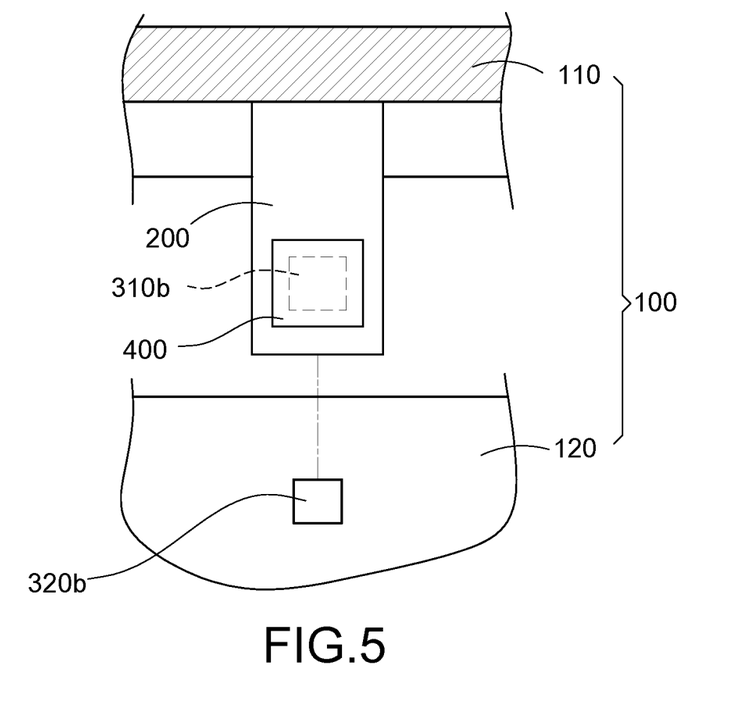
FIGS. 5 and 6 are perspective views showing another type of a first fastening structure and a second fastening structure of the case of electric device according to the first embodiment of this disclosure.
Figure 6:
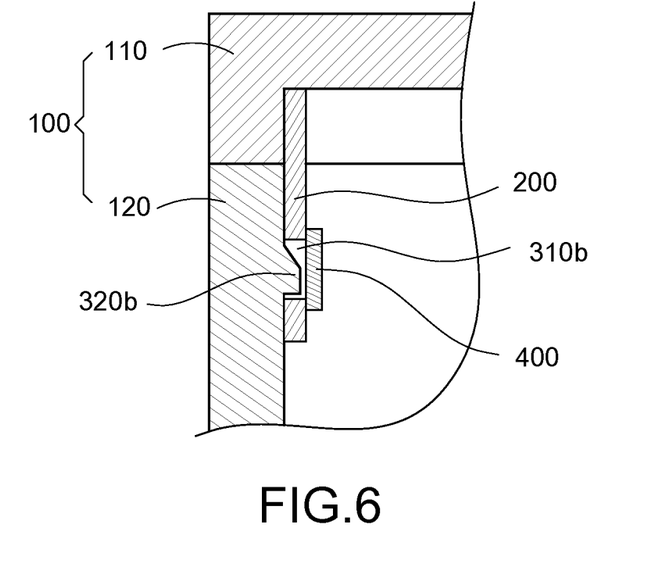
Figure 7:
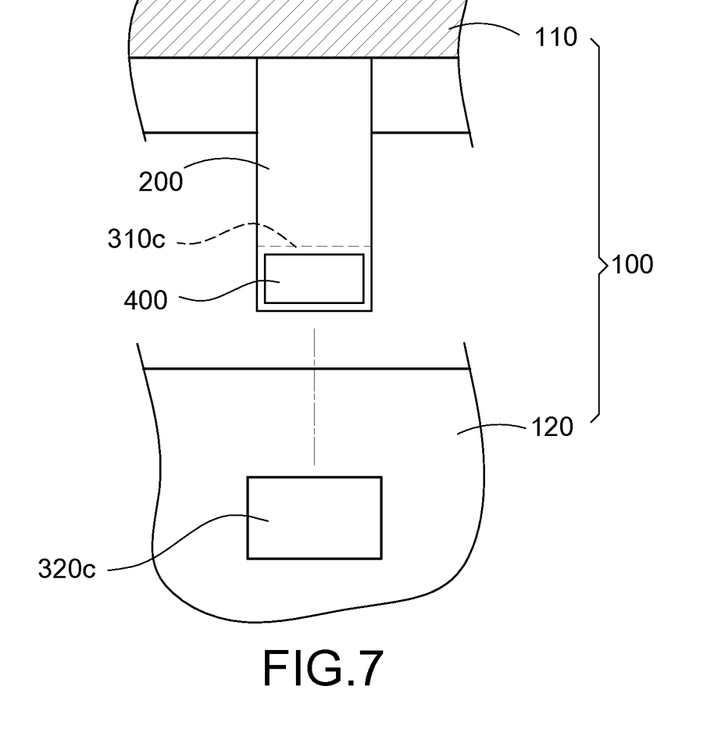
FIGS. 7 and 8 are perspective views showing further another type of a first fastening structure and a second fastening structure of the case of electric device according to the first embodiment of this disclosure.
Figure 8:
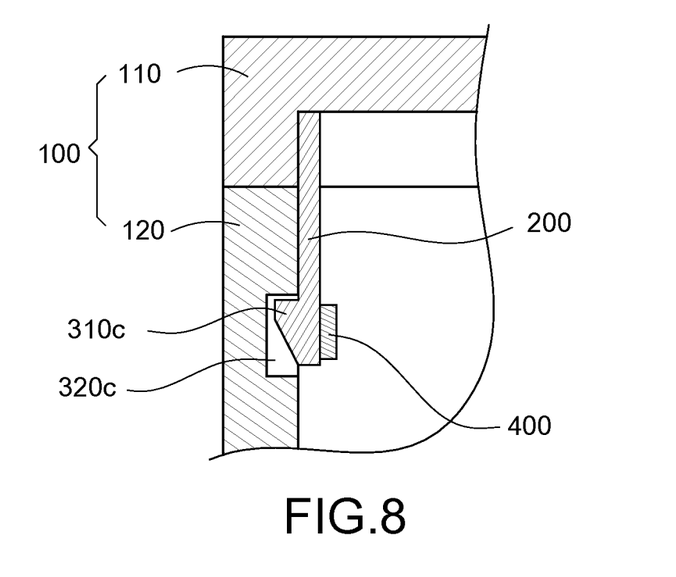

According to this embodiment, the first fastening structure 310 and the second fastening structure 320 should not be limited to types aforementioned. According to another possible example illustrated in FIGS. 5 and 6, the first fastening structure 310b may be a buckling hole, and the second fastening structure 320b may be a latch for buckling the buckling hole. According to further another possible example illustrated in FIGS. 7 and 8, the second fastening structure 320c may be a buckling hole, and the first fastening structure 310c may be a latch for buckling the buckling hole.

Figure 9:
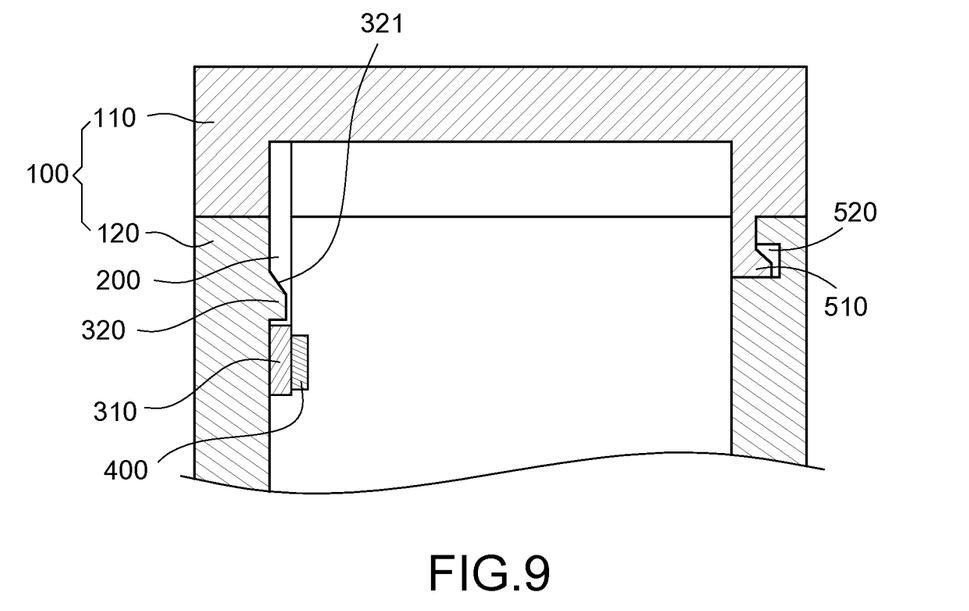
FIG. 9 is a perspective view showing a case of electric device according to the second embodiment of this disclosure.

According to FIG. 9, the second embodiment of this disclosure provides a case of electric device having a box 100, an elastic arm 200, a first fastening structure 310, a second fastening structure 320, a first connecting structure 510, a second connecting structure 520 and a magnet 400. According to this embodiment, the box 100, the elastic arm 200, the first fastening structure 310, the second fastening structure 320 and the magnet 400 are the same as the first embodiment aforementioned and these will not be repeated here after.

According to this embodiment, the first connecting structure 510 is arranged on the first housing 110 and at the side on the first housing 110 opposite to the first fastening structure 310. The second connecting structure 520 is arranged on the second housing 120 and at the side of the second housing 120 opposite to the second fastening structure 320. Both of the first connecting structure 510 and the second connecting structure 520 are rigid structures which are not elastically deformable. The first connecting structure 510 is connected to the second connecting structure 520 before closing the cover, and the first fastening structure 310 is then buckled with the second fastening structure 320 to close the cover.

Figure 10:
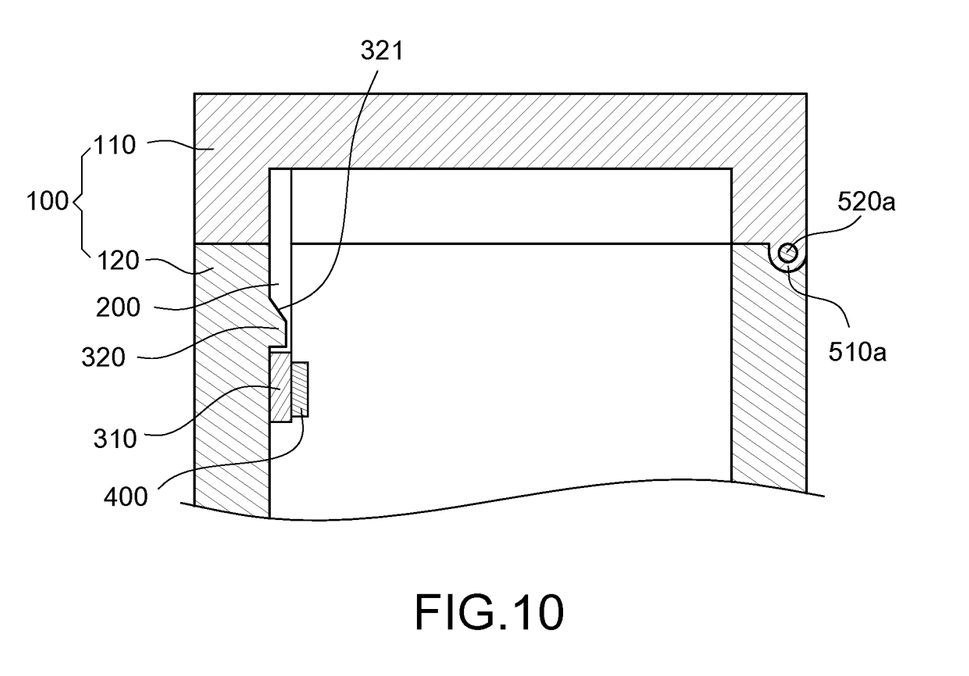
FIG. 10 is a perspective view showing another type of the case of electric device according to the second embodiment of this disclosure.

According to this embodiment, the first connecting structure 510 and the second connecting structure 520 may be buckled with each other, but scopes of this disclosure should not be limited to the embodiment. According to an example shown in FIG. 10, the first connecting structure 510a may be pivoted with the second connecting structure 520a.

Figure 11:
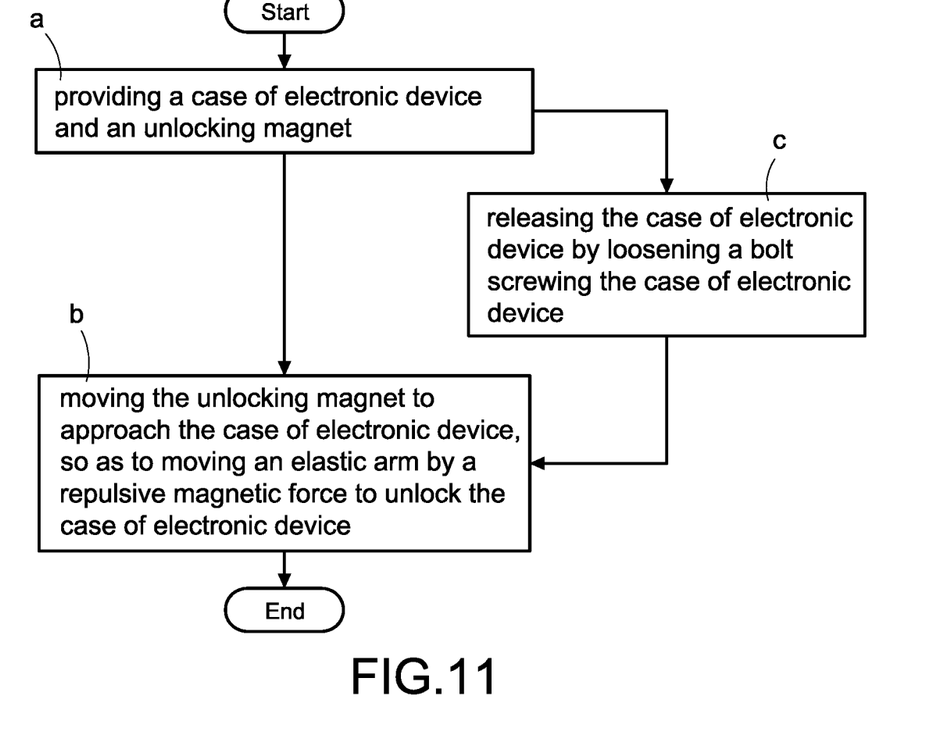
FIG. 11 is a flow chart showing steps of an unlocking method of the case of electric device.

An unlocking method of the case of electric device aforementioned has following steps.

According to FIGS. 1 to 4 and 11 the case of electric device aforementioned is provided firstly. Specifically, the case of electric device has a box 100, an elastic arm 200, a first fastening structure 310, a second fastening structure 320 and a magnet 400. The box 100 has a first housing 110 and a second housing 120 closed with the first housing 110. The elastic arm 200 is arranged in the first housing 110 and at the side of the first housing 110 aforementioned, and at least a portion of the elastic arm 200 is extended beyond the edge of the first housing 110. The first fastening structure 310 is arranged at one side on the elastic arm 200 and located beyond the edge of first housing 110. The second fastening structure 320 is arranged on an internal surface of the second housing 120 and at the side of the second housing 120 aforementioned, the first fastening structure 310 and the second fastening structure 320 are buckled with each other. The magnet 400 has a first magnetic pole 410, the first magnetic pole 410 is disposed to face the internal surface of the second housing 120.

According to FIGS. 1 to 4 and 12, furthermore, an unlocking magnet 400*b* is provided, and the unlocking magnet 400*b* has a second magnetic pole 410*b*. The second magnetic pole 410*b* is the same as the first magnetic pole 410 in magnetic polarity.

Figure 12:
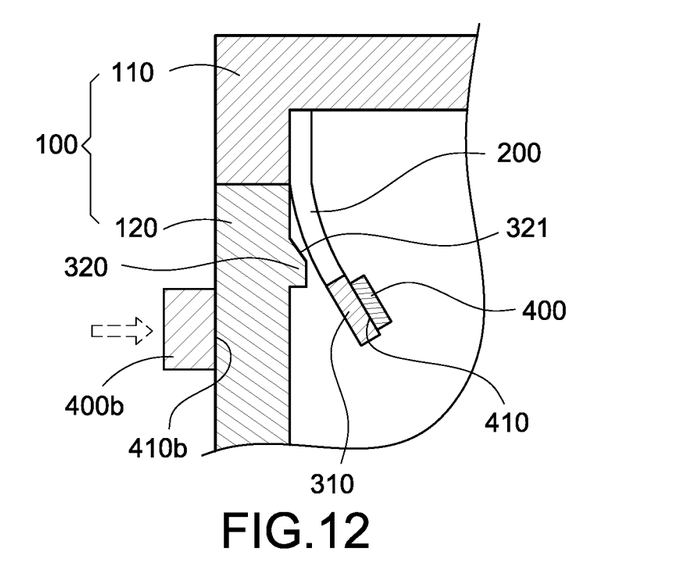
FIG. 12 is a perspective view showing an operation of the unlocking method of the case of electric device.

If the first housing 110 is screwed with the second housing 120 by the bolt 600, the bolt 600 should be loosened in advance so as to release the first housing 110 from the second housing 120. Then, the unlocking magnet 400*b* is moved to approach a position corresponding to the magnet 400 on an external surface of the second housing 120. Moreover, the second magnetic pole 410*b* is facing to the first magnetic pole 410 when the unlocking magnet 400*b* is closing to the magnet 400.

The second magnetic pole 410*b* is moved to approach the first magnetic pole 410, thereby causing a repulsive magnetic force between first magnetic pole 410 and the second magnetic pole 410*b*, and the magnet 400 is moved away from the unlocking magnet 400*b* by the repulsive magnetic force. Moreover, the elastic arm 200 is deflected when the magnet 400 is moving, thereby release the first fastening structure 310 from the second fastening structure 320.

Accordingly, a first fastening structure 310 and second fastening structure 320 buckled with each other are disposed in the case of electric device of this disclosure has so as to lock the first housing 110 with the second housing 120 to prevent locking structures from exposing, so that the case of electric device is prevented from being opened by an unexpected person. An expected operator may move the magnet 400 on the elastic arm 200 by the unlocking magnet 400*b* so as to release the first fastening structure 310 from the second fastening structure 320.

Although this disclosure has been described with reference to the foregoing preferred embodiment, it will be understood that the disclosure is not limited to the details thereof. Various equivalent variations and modifications can still occur to those skilled in this art in view of the teachings of this disclosure. Thus, all such variations and equivalent modifications are also embraced within the scope of this disclosure as defined in the appended claims.

What is claimed is:

1. A case of electric device, comprising:
   a box, comprising a first housing and a second housing closed with the first housing;
   an elastic arm, arranged in the first housing, the elastic arm located at one side of the first housing, and at least a portion of the elastic arm extended beyond an edge of the first housing;
   a first fastening structure, arranged on the elastic arm and located beyond the edge of the first housing;
   a second fastening structure, arranged on an internal surface of the second housing and at one side of the second housing, the first fastening structure and the second fastening structure buckled with each other; and
   a magnet, arranged on the elastic arm.

2. The case of electric device according to claim 1, wherein the magnet is located beyond the edge of the first housing.

3. The case of electric device according to claim 1, wherein the magnet is arranged on the elastic arm corresponding to a position of the first fastening structure.

4. The case of electric device according to claim 1, wherein one of the first fastening structure and the second fastening structure is a buckling hole, and another of the first fastening structure and the second fastening structure is a latch buckling the buckling hole.

5. The case of electric device according to claim 1, wherein the second fastening structure is a protrusion block, the first fastening structure is a latch buckling the protrusion block.

6. The case of electric device according to claim 1, further comprising:
   a first connecting structure, arranged at another side of the first housing opposite to the first fastening structure; and
   a second connecting structure, arranged at another side of the second housing opposite to the second fastening structure,
   wherein the first connecting structure is connected with the second connecting structure.

7. The case of electric device according to claim 1, further comprising:
   another elastic arm disposed at another side of the first housing opposite to the first fastening structure and provided with a first fastening structure; and
   another second fastening structure disposed at another side of the second housing opposite to the second fastening structure,
   wherein the first fastening structures are buckled with the second fastening structures respectively.

8. The case of electric device according to claim 1, further comprising at least one bolt, the first housing and the second housing are screwed with each other by the bolt.

9. The case of electric device according to claim 1, wherein the second fastening structure comprises a guiding slope capable of guiding the first fastening structure to move to a position to buckle the second fastening structure.

10. An unlocking method of a case of electric device, comprising following steps:
   a) providing a case of electric device and an unlocking magnet, the case of electric device comprising a box, an elastic arm, a first fastening structure, a second fastening structure and a magnet, the box comprising a first housing and a second housing closed with the first housing, the elastic arm arranged in the first housing and at one side of the first housing, at least a portion of the elastic arm extended beyond the edge of the first housing, the first fastening structure arranged on the elastic arm and beyond the edge of the first housing, the second fastening structure arranged on an internal surface of the second housing and at one side of the second housing, the first fastening structure and the second fastening structure buckled with each other, the magnet comprising a first magnetic pole, the first magnetic pole facing the internal surface of the second housing, the unlocking magnet comprising a second magnetic pole the same as the first magnetic pole in magnetic polarity;

b) moving the unlocking magnet to approach a position corresponding to the magnet, the position defined on an external surface of the second housing, and the second magnetic pole disposed toward the first magnetic pole so as to move the magnet away from the unlocking magnet by a repulsive magnetic force between the first magnetic pole and the second magnetic pole, and the magnet deflecting the elastic arm when moving so as to release the first fastening structure from the second fastening structure.

11. The unlocking method of the case of electric device according to claim 10, wherein, in step a, the first housing and the second housing are screw with each other by a bolt, and the unlocking method further comprising a step between step a and step b:

c) loosening the bolt to release the first housing from the second housing.

* * * * *